United States Patent [19]

Takasaki

[11] Patent Number: 4,961,156
[45] Date of Patent: Oct. 2, 1990

[54] SIMULATION CAPABLE OF SIMULTANEOUSLY SIMULATING A LOGIC CIRCUIT MODEL IN RESPONSE TO A PLURALITY OF INPUT LOGIC SIGNALS

[75] Inventor: Shigeru Takasaki, Tokyo, Japan
[73] Assignee: NEC Corporation, Tokyo, Japan
[21] Appl. No.: 263,217
[22] Filed: Oct. 27, 1988

[30] Foreign Application Priority Data

Oct. 27, 1987 [JP] Japan .................................. 62-269350
Feb. 29, 1988 [JP] Japan .................................. 63-46103

[51] Int. Cl.⁵ .......................... G06F 15/20; G06F 7/38
[52] U.S. Cl. .................................... 364/578; 364/489; 364/490
[58] Field of Search ...................... 364/489, 490, 578; 371/23

[56] References Cited

U.S. PATENT DOCUMENTS

| | | | |
|---|---|---|---|
| 4,669,083 | 5/1987 | Laviron | 364/578 |
| 4,713,606 | 12/1987 | Laviron | 364/578 |
| 4,715,035 | 12/1987 | Boehner | 364/578 |
| 4,727,545 | 2/1988 | Glackemeyer et al. | 364/578 |
| 4,763,289 | 8/1988 | Barzilai et al. | 364/578 |
| 4,769,817 | 9/1988 | Krohn et al. | 371/23 |
| 4,775,950 | 10/1988 | Terada et al. | 364/578 |
| 4,782,440 | 11/1988 | Nomizu et al. | 364/578 |
| 4,791,578 | 12/1988 | Fazio et al. | 371/23 |
| 4,827,427 | 5/1989 | Hyduke | 364/578 |

Primary Examiner—Gary Chin
Assistant Examiner—Chrishopher L. Makay
Attorney, Agent, or Firm—Sughrue, Mion, Zinn, Macpeak & Seas

[57] ABSTRACT

In a logic simulator for simulating a logic circuit model which is operable in response to first through k-th input logic signals where k is a natural number greater than unity, the first through k-th input logic signals are read out of a memory to simultaneously carry out first through k-th simulations of the logic circuit model and to simultaneously produce first through k-th simulation result signals. The simulation result signals are compared with one another to detect an event different from a normal event and to carry out further simulations in connection with the different event. When the model is assorted into first through last ranks, the simultaneous simulations proceed from the first rank to the last rank one by one. A plurality of faults can also be simultaneously simulated by the logic simulator with a single one of the input logic signals set to the model. The simultaneous simulations can be carried out by first through k-th simulation units which are operable in cooperation with a simulation controller and the memory and which individually executes the first through k-th simulations.

12 Claims, 8 Drawing Sheets

SIMULATION CAPABLE OF SIMULTANEOUSLY SIMULATING A LOGIC CIRCUIT MODEL IN RESPONSE TO A PLURALITY OF INPUT LOGIC SIGNALS

BACKGROUND OF THE INVENTION

This invention relates to a logic simulator and a simulation method which are for use in simulating a logic circuit model.

A conventional simulation has been proposed by M. A. Breuer and A. D. Friedman in "Diagnosis & Reliable Design of Digital Systems", pages 174–241, published by Computer Science Press, Inc. (Maryland) and is carried out by the use of software. When a logic circuit of a large scale is simulated by software in a manner mentioned by M. A. Breuer et al, a very long time is necessary because a simulation time for the simulation is proportional to a square of the scale of the logic circuit, as known in the art.

Recently, there has been proposed a logic simulator which carries out simulations by the use of hardware and which will be called a hardware simulator hereinafter. Such a hardware simulator is disclosed by G. F. Pfister in an article entitled "The Yorktown Simulation Engine: Introduction" and contributed to Proc. 19th Design Automat. Conf., June 1982. The hardware simulator is very effective to simulate logical operations of checking whether or not the logic circuit is normal and which will be referred to as normal logic operations. However, it is difficult for the hardware simulator to simulate operations which might be carried out on occurrence of faults in a logic circuit and which will be called fault simulation operations. In other words, the hardware simulator is exclusively used only for the normal logic operations.

In U.S. Pat. No. 4,725,975 issued to Tohru Sasaki, assignor to NEC Corporation, a logic simulator simulates a logic circuit model by dividing the model into logic blocks and classifying the blocks by levels according to flow of signals in the model. The simulations are successively carried out by logic operations of the blocks on each level.

At any rate, each simulation is carried out one by one by supplying a single kind of input logic values or signals to a single model. This shows that the single kind of the input logic signals alone is given to simulate the single model. Accordingly, it takes an extremely long time to simulate the fault simulation operations of each model because a wide variety of faults take place at each model.

SUMMARY OF THE INVENTION

It is an object of this invention to provide a logic simulator which can quickly simulate a logic circuit model.

It is another object of this invention to provide a logic simulator of the type described, wherein faults of the logic circuit model can be quickly simulated in addition to normal operation of the logic circuit model.

According to an aspect of this invention, a logic simulator is for use in simulating a logic circuit model which is operable in response to first through k-th kinds of input data signals to produce an output signal where k represents a natural number greater than unity and comprises signal producing means for producing the first through k-th kinds of the input data signals, simulation means supplied from the signal producing means with the first through k-th kinds of the input data signals for simultaneously carrying out first through k-th simulations of the logic circuit model in response to the first through k-th kinds of the input data signals to produce first through k-th simulation result signals which are representative of results of the first through k-th simulations, respectively, and processing means for processing the first through k-th simulation result signals to produce the output signal.

According to another aspect of this invention, a logic simulator is for use in simulating a logic circuit model which comprises a plurality of logic elements which are classified by logic types representative of logic operations. The logic simulator comprises signal producing means for producing, at every one of the logic elements, the first through k-th kinds of the input data signals together with each of the logic types, first through k-th simulation means supplied with the first through k-th kinds of the input data signals, respectively, and with each logic type in common for simultaneously carrying out first through k-th simulations of the selected one of the logic types to produce first through k-th simulation result signals which are representative of results of the first through k-th simulations, respectively, and evaluating means coupled to the first through k-th simulation means for evaluating the first through k-th simulation result signals into the output signal.

DESCRIPTION OF THE PREFERRED EMBODIMENTS

Figure 1:
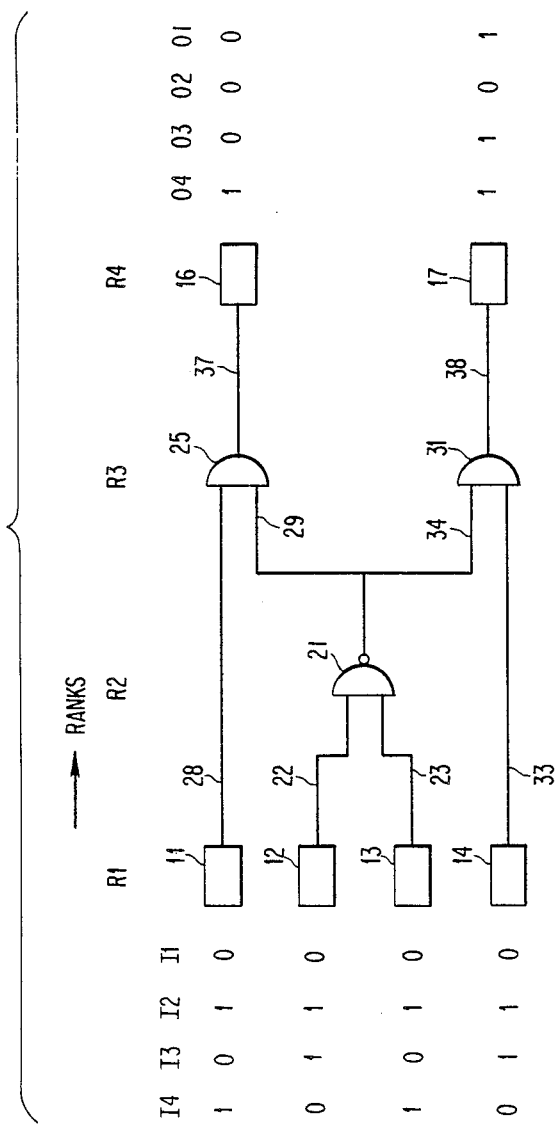
FIG. 1 is a circuit diagram of a logic circuit model which can be simulated by this invention.

Referring to FIG. 1, description will be made as regards a logic circuit model which can be simulated in accordance with this invention. The illustrated logic circuit model comprises first through fourth primary input terminals 11, 12, 13, and 14, first and second primary output terminals 16 and 17, and a plurality of logic elements arranged between the first through fourth primary input terminals 11 to 14 and the first and the second primary output terminals 16 and 17. The logic elements are classified into logical types, such as AND, OR, and the like. The logic circuit model comprises, as the logic elements, a NAND gate 21 connected to the second and the third primary input terminals 12 and 13 through first and second signal lines 22 and 23, an AND gate 25 connected to the first primary input terminal 11 and the NAND gate 21 through third and fourth signal lines 28 and 29, and an OR gate 31 connected to the fourth primary input terminal 14 and the NAND gate 21 through fifth and sixth signal lines 33 and 34. The AND and the OR gates 25 and 31 are connected to the first and the second primary output terminals 16 and 17 through seventh and eighth signal lines 37 and 38, respectively.

In the example being illustrated, the logic circuit model is assorted from the first through fourth primary input terminals 11 to 14 to the first and the second primary output terminals 16 and 17 into first through fourth ranks R1 to R4. The first through fourth primary input terminals 11 to 14 belong to the illustrated first rank R1 while the first and the second primary output terminals 16 and 17 belong to the fourth rank R4. Likewise, the NAND gate 21 belongs to the second rank R2 while the AND gate 25 and the OR gate 31 belong to the third rank R3.

On simulating the illustrated logic circuit model, first through fourth kinds I1, I2, I3, and I4 of input logic signals are given as test data patterns from a memory (later shown) to the first through fourth primary input terminals 11 to 14, respectively. As shown in FIG. 1, the first kind I1 of the input logic signals has a four-bit pattern of (0000) while the second through fourth kinds I2 to I4 have four-bit patterns of (1111), (0101), and (1010), respectively. Each four-bit pattern is successively numbered from an uppermost bit, namely, first bit to a lowermost bit, namely, fourth bit. The logic circuit model produces first through fourth output model signals 01, 02, 03, and 04 as an output signal in response to the first through fourth kinds I1 to I4 of the input logic signals. As is readily understood from FIG. 1, output patterns (01), (00), (01), and (11) are supplied as the first through fourth output model signals 01 to 04 in response to the first through fourth kinds I1 to I4 of the input logic signals illustrated in FIG. 1, respectively.

Heretofore, simulations of the illustrated logic circuit model are carried out by giving each of the first through fourth kinds I1 to I4 of the input logic signals to the primary and intermediate input terminals of the ranks one by one and by monitoring each intermediate output signal at every rank of the logic circuit model. Accordingly, it takes a long time to simulate the logic circuit model from the first rank R1 to the fourth rank R4.

Figure 2:
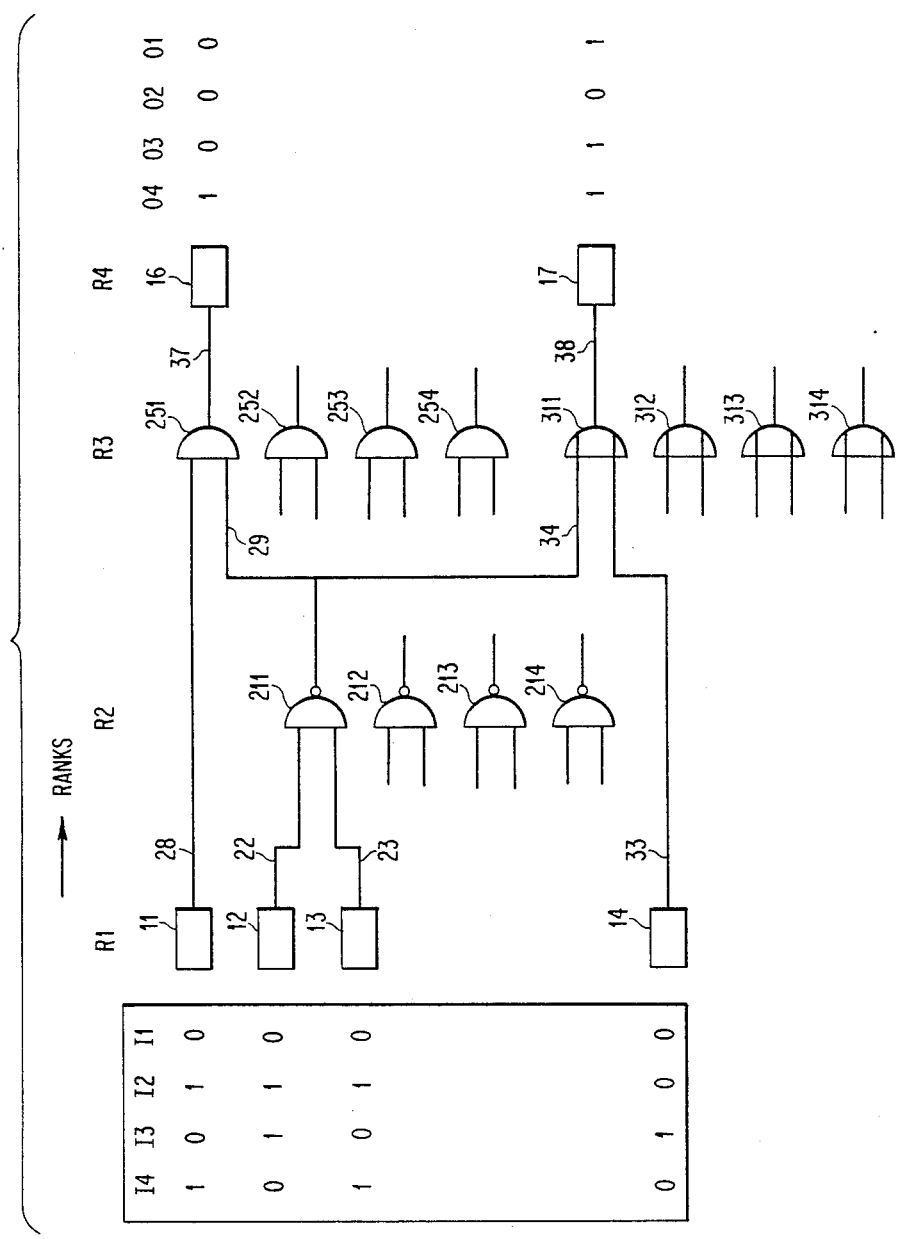
FIG. 2 is a circuit diagram of a modified logic circuit model for use in describing simulations according to this invention.

Referring to FIG. 2, a logic simulator according to a first embodiment of this invention carries out simulations of the logic circuit model illustrated in FIG. 1 in a manner to be described with reference to FIG. 2. This means that the logic circuit model of FIG. 1 is recognized as a modified logic circuit model in the logic simulator, as shown in FIG. 2. The logic simulator may implement the modified logic circuit model either by software or by hardware, although description will mainly be made about simulations carried out by the use of hardware. More specifically, the modified logic circuit model comprises similar parts designated by like reference numerals and symbols and is divided into first through fourth ranks R1 to R4 from the first through fourth primary input terminals 11 to 14 to the first and the second primary output terminals 16 and 17. However, it is to be noted that each rank of the modified logic circuit model comprises a plurality of logic elements equal in number to the number of the input logic signals. For example, first through fourth ones of NAND gates 211, 212, 213, and 214 are located in the second rank R2 in one-to-one correspondence to the first through fourth kinds I1 to I4 of the input logic signals and are logically equivalent to the NAND gate 21 of FIG. 1. Likewise, first through fourth AND gates 251, 252, 253, and 254 and first through fourth OR gates 311, 312, 313, and 314 are arranged in the third rank R3 of the modified logic circuit model and are logically equivalent to the AND gate 25 and the OR gate 31 of FIG. 1, respectively. In this connection, four sets of the first through fourth primary input terminals 11 to 14 are included in the modified logic circuit model in one-to-one correspondence to the first through fourth kinds I1 to I4 of the input logic signals together with four sets of the first and the second primary output terminals 16 and 17, although only one set of the first through fourth primary input terminals 11 to 14 is illustrated in FIG. 2 along with one set of the first and the second primary output terminals 16 and 17.

Under the circumstances, it is readily understood that each of the illustrated gates 211 to 214, 251 to 254, and 311 to 314 can be simulated by the use of a single set of connection information signals which is common to that used in FIG. 1 and which is representative of connections in the logic circuit model. This shows that the single set of connection information signals is kept unchanged during the simulations of the logic circuit model.

With this structure, it is possible to simultaneously carry out simulations of each rank of the logic circuit model (FIG. 1) by simultaneously supplying the first through fourth kinds I1 to I4 of the input logic signals to the first rank R1. For this purpose, the first through fourth kinds I1 to I4 of the input logic signals are successively read out of a memory symbolized by a block depicted at 41 in FIG. 2 with reference to the connection information signal set kept in the memory 41 and model numbers assigned to the first through fourth gates 211 to 214. At any rate, the number of the input logic signals simultaneously read out may be greater than unity. As a result, a plurality of events specified by the input logic signals can be simultaneously simulated by the illustrated logic simulator. This shows that the logic simulator can quickly process the simulations of a logic circuit model in a manner to be described below. The simulations may be either normal logic simulations of simulating logic operations of each logic element or fault simulations of simulating faults which might occur in each logic element. The logic simulator may therefore be selectively operable in a normal simulation mode and a fault simulation mode for the normal logic and the fault simulations, respectively.

Figure 3:
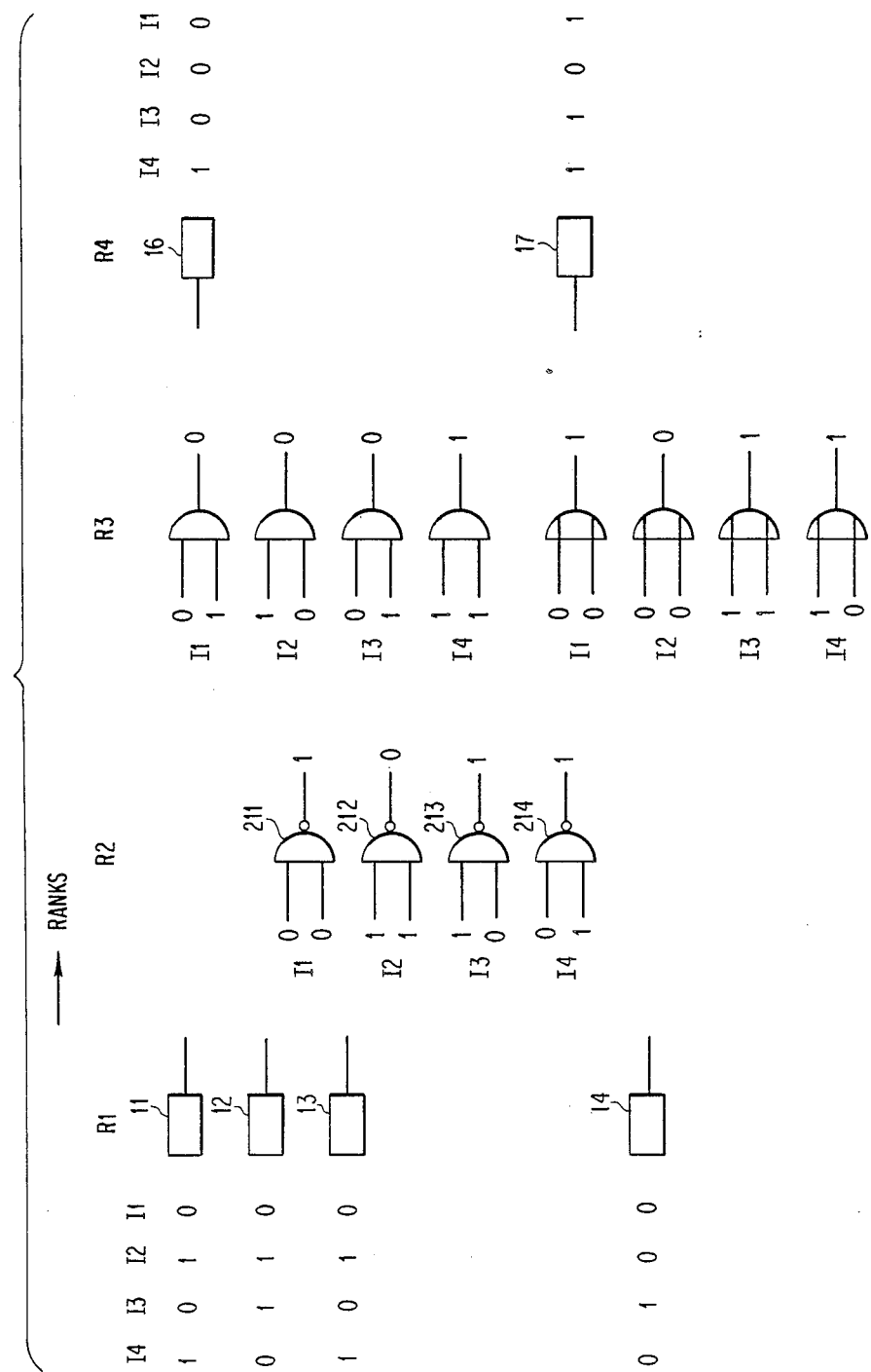
FIG. 3 is a diagram for use in describing procedure of the simulations according to this invention.

Referring to FIG. 3 together with FIG. 2, the normal simulations of the modified logic circuit model is started by giving, as first through fourth sets of input data signals, the first through fourth kinds I1 to I4 of the input logic signals to four sets of the first through fourth primary input terminals. In the example being illustrated, the first through fourth kinds I1 to I4 of the input logic signals are supplied from the memory 41 (FIG. 2) to the four sets of the first through fourth primary input terminals and are delivered to the second and the third ranks R2 and R3 of the modified logic circuit model in accordance with the connection information signal set.

The first through fourth NAND gates 211 to 214 in the second rank R2 are supplied with second and third bits of the first through fourth kinds of the input logic signals through the second and the third primary input terminals 12 and 13 and the second and the third signal lines 22 and 23, respectively. As a result, the first through fourth NAND gates 211 to 214 are supplied with the logic signals of (00), (11), (10), and (01) to simultaneously produce first through fourth simulation result signals of logic levels 1, 0, 1, and 1, respectively, as shown at the first rank of FIG. 3. The first through fourth simulation result signals of 1, 0, 1, and 1 are transmitted to the first through fourth AND gates 251 to 254, respectively, on one hand, and to the first through fourth OR gates 311 to 314, respectively, on the other hand. Each simulation result signal is sent through the fourth signal line 29 (FIG. 2) to the first through fourth AND gates 252 to 254 and is also sent through the sixth signal line 34 (FIG. 2) to the first through fourth OR gates 311 to 314. Each of the fourth and the sixth signal lines 29 and 34 can be specified by the connection information signals.

Practically, simulation result signals may be transmitted from a preceding rank to a next following rank only when the simulation result signals are changed from initial states. More particularly, let each of the first through fourth NAND gates 211 to 214 have the logic "0" level in the initial states. Taking this into consideration, it is understood that changes of the states occur in the first, the third, and the fourth NAND gates 211, 213, and 214. Such changes may be recognized as occurrence of a different event while no change of states may be recognized as occurrence of a normal event.

In this event, only the first, the third, and the fourth simulation result signals are sent to the first, the third, and the fourth AND gates 251, 253, and 254 and to the first, the third, and the fourth OR gates 311, 313, and 314. The first, the third, and the fourth result signals are practically combinations of the logic "1" levels and the model numbers of the first, the third, and the fourth NAND gates 211, 213, and 214.

Subsequently, the first through fourth AND gates 251 to 254 and the first through fourth OR gates 311 to 314 simultaneously carry out logic operations to simultaneously produce the first through fourth output model signals 01 to 04. Herein, the first through fourth AND gates 251 to 254 have first input terminals supplied with the first bits "0", "1", "0", and "1" of the first through fourth kinds of the input logic signals, respectively, and second input terminals supplied with "1", "0", "1", from the first through fourth AND gates 211 to 214, respectively. Practically, states of the second input terminals of the first, the third, and the fourth AND gates 251, 253, and 254 are changed from initial states while a state of the second input terminal of the second AND gate 252 is kept unchanged from an initial state. This applies to operations of the first through fourth OR gates 311 to 314. Thus, the logic elements of the third rank R3 are simultaneously simulated in the above-mentioned manner by the use of the plurality of the test patterns.

At any rate, the modified logic circuit illustrated in FIG. 2 is divisible into a first section formed by the first and the second ranks R1 and R2 and a second section formed by the third and the fourth sections R3 and R4. The first section equivalently serves to simultaneously carry out the first through fourth simulations of the logic circuit model illustrated in FIG. 1 and may be called a simulation circuit. On the other hand, the second section serves to process the simulation result signals sent from the first section and to produce the output signal. Therefore, the second section may be referred to as a processing circuit.

Figure 4:
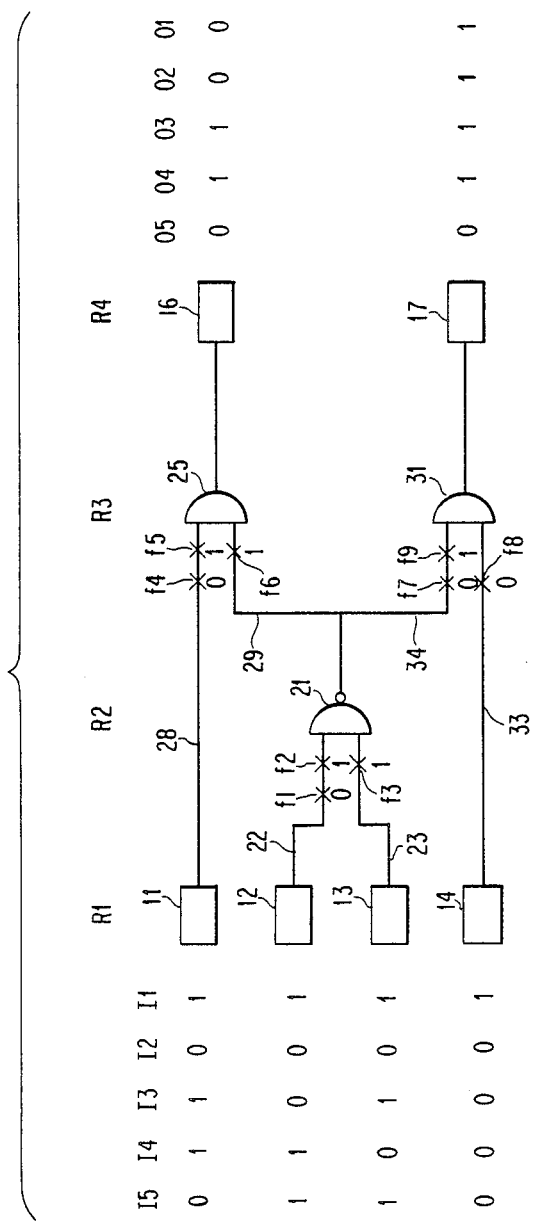
FIG. 4 is a circuit diagram of a logic circuit model which is similar to that illustrated in FIG. 1 and in which faults are defined.

Referring to FIG. 4, description will be made as regards the fault simulations carried out in connection with a logic circuit model which is identical with that illustrated in FIG. 1, on the assumption that faults take place in the logic circuit model. As is known in the art, the faults are assorted into a stuck-at-0 and a stuck-at-1 fault which are practically attained by fixedly giving the logic "0" level and the logic "1" level on signal lines in question, respectively.

In FIG. 4, first and second faults of the stuck-at-0 and the stuck-at-1 are hypothetically defined on the first signal line 22, as symbolized at f1 and f2, respectively, while a third fault of the stuck-at-1 is defined on the second signal line 23, as shown at f3. Likewise, fourth and fifth faults f4 and f5 are of the stuck-at-0 and the stuck-at-1 faults, respectively, and are defined on the third signal line 28 while a sixth fault f6 of the stuck-at-1 is defined on the fourth signal line 29. In addition, seventh and eighth faults f7 and f8 are of the stuck-at-0 and the stuck-at-1, respectively, and are defined on the sixth signal line 34. In addition, a ninth fault f9 of the stuck-at-0 is defined on the fifth signal line 33. The first through ninth faults are given as parts of the input data signals together with a single logic signal, as will become clear later.

The fault simulations of the logic circuit model are assumed to be carried out by the use of each of first through fifth kinds I1 to I5 of input logic signals (as shown in FIG. 4) in consideration of the first through ninth faults f1 to f9 in a manner to be described later.

When no fault takes place in the logic circuit model, first through fifth output model signals 01 to 05 are produced from the logic circuit model in response to the first through fifth kinds I1 to I5 of the input logic signals, respectively.

Figure 5:
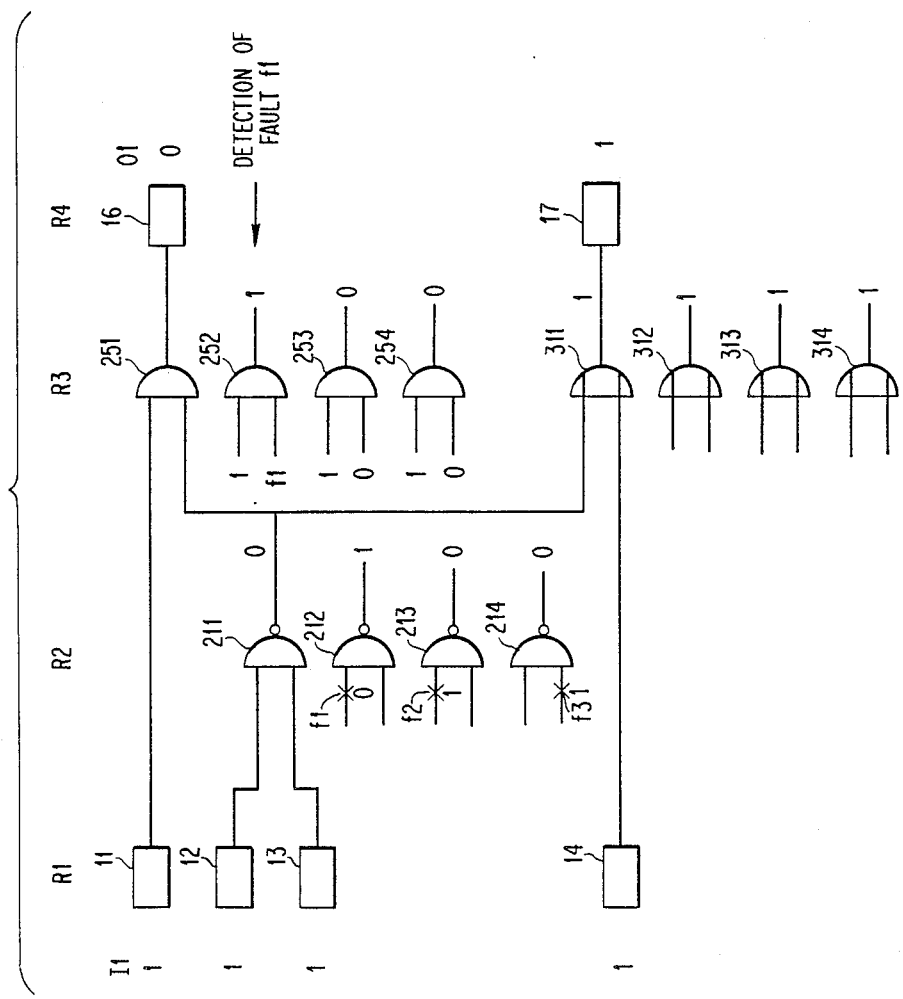
FIG. 5 is a circuit diagram of a modified logic circuit model which is similar to that illustrated in FIG. 2 and which is used to describe fault simulations.

Referring to FIG. 5, the fault simulations are made by the use of a modified logic circuit model identical with that illustrated in FIG. 2. In FIG. 5, the first through third faults f1 to f3 are simulated in response to the first kind I1 of the input logic signals specified by (1111), as shown in FIG. 4. The first kind I1 of the input logic signals is delivered as one of the input data signals to the second and the third ranks R2 and R3 of the modified logic circuit model.

In this event, the second rank of the modified logic circuit model is supplied with the second and the third bits of the first kind of the input logic signals to be simulated. In this event, the second rank is formed by the first through fourth NAND gates 211 to 214 like in FIG. 2. The first gate 211 is used to carry out a normal logic simulation similar to that described in FIG. 1. On the other hand, the first through third faults f1 to f3 are set to the second through fourth NAND gates 212 to 214, as illustrated in FIG. 5, respectively. Under the circumstances, the first through fourth NAND gates 211 to 214 simultaneously produce, as first through fourth NAND gate output signals, the logic "0", "1", "0", and "0" levels, respectively. This means that the first through fourth NAND gates 211 to 214 are simultaneously simulated.

Among the first through fourth NAND gate output signals, only the second NAND gate output signal is different from the first NAND gate output signal which is produced as a result of a normal logic operation. Therefore, the first fault f1 of the stuck-at-0 alone may be transmitted as a simulation result signal to the third rank R3 to be subjected to a further simulation. The simulation result signal may be a combination of the number assigned to the second NAND gate 212 and the logic level of the first fault f1.

In the third rank R3, a fault simulation is executed, based on the first fault f1, simultaneously with a normal logic simulation based on each normal one of the NAND gate output signals. Both results of the fault and the normal logic simulations are compared with each other. In the example being illustrated, an output signal of the second AND gate 252 alone is different from a normal output signal of the first AND gate 251. This shows that the first fault f1 is propagated to the first output terminal 01 and can be detected at the first output terminal 16.

Figure 6:
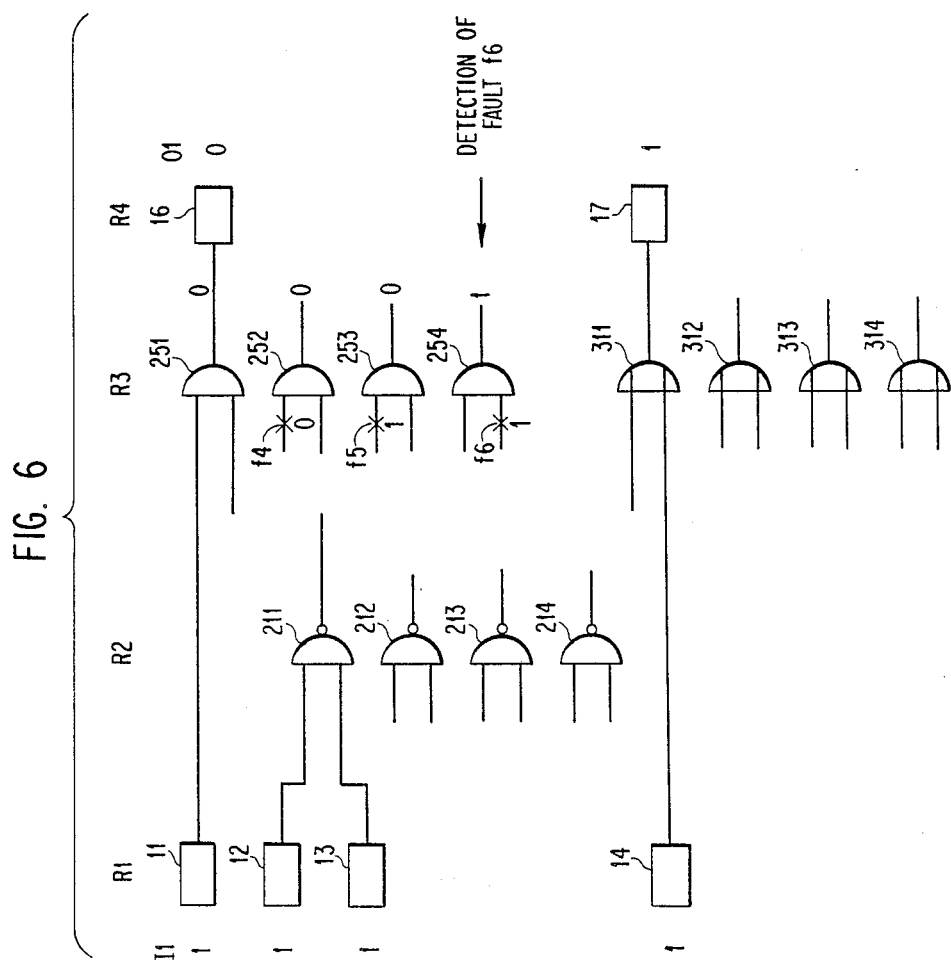
FIG. 6 is a diagram for use in describing procedure of the fault simulations carried out by the use of the modified logic circuit model illustrated in FIG. 2.

Referring to FIG. 6, the fault simulations are simultaneously carried out as regards the fourth through sixth faults f4 to f6 related to the AND gate 25 (FIG. 4). In this case, the first AND gate 251 carries out a normal logic operation while the second through fourth AND gates 252 to 254 are operated in consideration of the fourth through sixth faults f4 to f6 so as to simultaneously simulate the fourth through sixth faults f4 to f6. As is illustrated in FIG. 6, it is found that an output signal of the fourth AND gate 254 alone is different from a normal output signal produced from the first AND gate 251. This means that the sixth fault f6 of the stuck-at-1 is detected as a result of the fault simulations.

Thus, three faults can be simultaneously simulated by the use of the modified logic circuit model because four sets of logic elements are arranged in each rank in the manner illustrated in FIG. 6.

Although description has thus far been made about the logic circuit model of a small size, it is possible to simulate a logic circuit model of a large size in the above-mentioned manner. On simulating such a large size model, the model which has a plurality of ranks may be divided into a plurality of sub-models. It is possible to process simulations of the large size model at a high speed by simultaneously simulating each rank in every one of the sub-models. Such division of a logic circuit model is very effective when the simulations are carried out by the use of a hardware circuit.

At any rate, the number of the logic elements which carry the same logic operation is not restricted to four but may be greater than unity.

Figure 7:
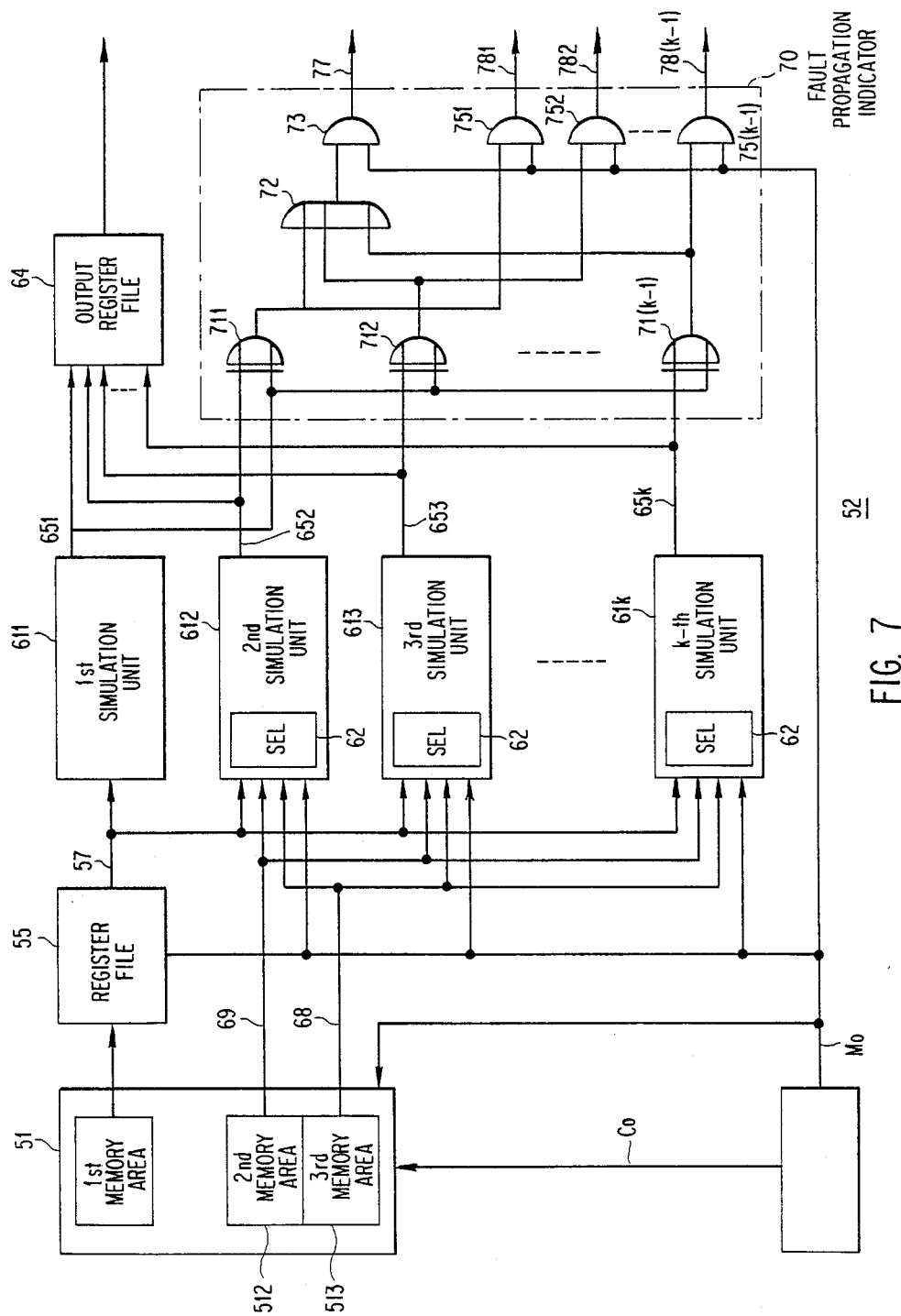
FIG. 7 is a block diagram of a logic simulator according to this invention.

Referring to FIG. 7, a logic simulator according to a second embodiment of this invention carries out simulations in a manner similar to that illustrated in FIGS. 2 through 6. The illustrated logic simulator is implemented by hardware, as will become clear, and is selectively operable in a normal simulation mode (as illustrated in FIGS. 2 and 3) and a fault simulation mode (as shown in FIGS. 5 and 6) so as to carry out the normal logic and the fault simulations. The illustrated logic simulator comprises a simulation controller 50, a memory 51, and a simulation circuit 52. The simulation controller produces a mode selection signal Mo indicative of either the normal simulation mode or the fault simulation mode in addition to a control signal Co. The mode selection signal Mo takes the logic "0" and "1" levels when the normal and the fault simulation modes are indicated, respectively, and is delivered to the simulation circuit 52 and the memory 51. On the other hand, the control signal Co is delivered to the memory 51.

The memory 51 comprises a first memory area 511, a second memory area 512, and a third memory area 513. The first memory area 511 has a plurality of addresses assigned to logic elements, respectively. Thus, the logic elements are specified by address numbers, respectively. Each address is loaded with a set of input logic signals, such as the first through fourth kinds I1 to I4 of the input logic signals, which correspond to every one of logic elements. In addition, each address of the first memory area 511 is also loaded as a logic type signal with a logic type of each logic element. Therefore, a combination of a set of input logic signals (namely, an input logic signal set) and the logic type signal is read out of each address when each address is accessed by the control signal Co.

The second memory area 512 is loaded with line number signals representative of signal lines of a logic circuit model on which faults are defined in the manner illustrated in FIG. 5. As a result, each line number signal is read out of the second memory area 512 in the fault simulation mode. The third memory area 513 is loaded with fault signals which are representative of faults, such as the first through ninth faults, as shown in FIGS. 5 and 6 and which are read in the fault simulation mode.

The logic simulator comprises an input register file 55 which is supplied through a first signal line group 56 with a combination of the input logic signal set and a logic type in response to the control signal Co given from the simulation controller 50. The input logic signal set is formed, for example, by the first through fourth kinds I1 to I4 of the input logic signals. For generalization of description, first through k-th kinds of the input logic signals are assumed to be produced from the input register file 55.

The first through k-th kinds of the input logic signals are delivered as the input data signals through a second signal line group 57 to first through k-th operation units, namely, simulation units 611 to 61k of the simulation circuit 52, respectively. Each of the first through k-th simulation units 611 to 61k is a universal element which can simulate each type of the logic elements and which may be implemented, for example, by a microprocessor. In the example being illustrated, the first simulation unit 611 can carry out a normal logic simulation alone while each of the second through k-th simulation units 612 to 61k can selectively carry out a normal logic simulation and a fault simulation in a manner to be described later. In this connection, each of the second through k-th simulation units 612 to 61k is similar in structure to the first simulation unit 611 except that each of the second through k-th simulation units 612 to 61k comprises a selector collectively depicted at 62 in FIG. 7.

Referring back to FIG. 2 again together with FIG. 7, let the modified logic circuit illustrated in FIG. 2 carry out the normal simulation by the logic simulator shown in FIG. 7. In this event, the simulation controller 50 supplies the memory 51 and the simulation circuit 52 with the mode selection signal Mo of the logic "0" level representative of the normal logic simulation. Supplied with the mode selection signal Mo of the logic "0" level, the second through k-th simulation units 612 to 61k carry out the normal logic simulations.

On simulating the modified logic circuit model of FIG. 2 in the normal simulation mode, the first through fourth NAND gates 211 to 214 of the second rank R2 are at first simultaneously simulated by the first through fourth simulation units 611 to 614, respectively. More specifically, the first NAND gate 211 is logically simulated by the first simulation unit 611 while the second NAND gate 212 is logically simulated by the second simulation unit 612. Likewise, the third and the fourth NAND gates 213 and 214 are simulated by the third and the fourth simulation units 613 and 614, respectively. In this event, the logic type and the first through fourth kinds I1 to I4 of the input logic signals are read out of the register file 55 to be simultaneously sent to the first through fourth simulation units 611 to 614, respectively. The NAND gate is indicated as the logic type signal on simulating the second rank R2 illustrated in FIG. 2. The first through fourth simulation units 611 to 614 are supplied from the register file 55 with the second and the third bits (00), (11), (10), (01) of the first through fourth kinds I1 to I4 of the input logic signals as the logic signals, respectively. As a result, the first through fourth simulation units 611 to 614 produce the simulation result signals of (1011), as illustrated in FIG. 2. The simulation result signals of (1011) are sent to an output register file 64 through signal lines 651 to 654 to be stored therein.

Subsequently, the first through fourth AND gates 251 to 254 and the first through fourth OR gates 311 to 314 of the third rank R3 are simultaneously simulated in a manner similar to that mentioned above by the first through fourth simulation units 611 to 614, respectively. Thus, the normal logic simulations are successively carried out from a preceding rank to a next following rank in the manner illustrated in FIG. 3. Such operations per se are similar to those illustrated in FIG. 3 and will not be described any longer.

Let the logic simulator be used to carry out the fault simulations of the logic circuit model, as shown in FIGS. 4 and 5. In this event, the fault simulations are progressive in a manner similar to that illustrated in FIGS. 5 and 6 in the logic simulator of FIG. 7 also. Therefore, description will be made about the fault simulations of the first through ninth faults f1 to f9 which are defined in FIG. 4. It should be recollected that the first through third faults f1 to f3 are the stuck-at-0 fault, the stuck-at-1 fault, and the stuck-at-1 fault, respectively, while the fourth through sixth faults are the stuck-at-0 fault, the stuck-at-1 fault, and the stuck-at-1 fault, respectively. Likewise, the seventh through ninth faults are the stuck-at-0 fault, the stuck-at-0 fault, and the stuck-at-1 fault, respectively. In addition, the first kind (1111) (FIG. 5) of the input logic signals is assumed to be given as one of the input data signals to the logic simulator like in FIGS. 5 and 6.

Under the circumstances, the memory 51 and the first through fourth simulation units 611 to 614 are supplied with the mode selection signal Mo of the logic level "1" representative of the fault simulation mode. On the other hand, the first kind of the input logic signals and the logic type signal (the NAND) are read out of the first memory area 511 under control of the simulation controller 50 to be delivered through the input register file 55 to the first through fourth simulation units 611 to 614 so as to simulate the second rank of the logic circuit model (FIG. 4), respectively. In order to specify the first through third faults f1 to f3, fault types are read out of the third memory area 513. Subsequently, line numbers assigned to the signal lines are read as the connection information signals out of the second memory area 512 to define positions of the first through third faults f1 to f3. The fault types and the line numbers are sent as fault type signals and line number signals to the second through fourth simulation units 612 to 614 through third and fourth signal line groups 68 and 69. On the other hand, the first simulation unit 611 carries out the normal simulation of the first NAND gate 211 (FIG. 5) to produce a first simulation result signal. In the example being illustrated, the first through third faults f1 to f3 are set into the second through fourth simulation units 612 to 614, respectively. As a result, the second through fourth simulation units 612 to 614 carry out the fault simulations of the second through fourth NAND gates 212 to 214 in the manner illustrated in FIG. 5 to produce second through fourth simulation result signals.

The first through fourth simulation result signals are stored in the output register file 64 on one hand and are sent to a fault propagation indicator 70 on the other hand. The illustrated fault propagation indicator 70 is connected through the signal lines 651 to 65$k$ to the first through k-th simulation units 611 to 61$k$, respectively. The fault propagation indicator 70 comprises first through (k−1)-th Exclusive OR gates 711 to 71(k−1), an OR gate 72 connected to all of the Exclusive OR gates 711 to 71(k−1), an output AND gate 73, and first through (k−1)-th AND gates 751 to 75 (k−1).

As illustrated in FIG. 5, the first through fourth simulation units 611 to 614 supplies the first through fourth simulation result signals represented by (0100) as a result of the simulations of the first through fourth NAND gates 211 to 214 to the first through third Exclusive OR gates 711 to 713. Exclusive OR operations are carried out between the first and the second simulation result signals, between the first and the third simulation result signals, and between the first and the fourth simulation result signals in the first through third Exclusive OR gates 711 to 713 so as to detect incoincidence therebetween, respectively. In the example being illustrated, the first Exclusive OR gate 711 detects the incoincidence between the first and the second simulation result signals to produce the logic "1" level signal. The logic "1" level signal is sent as an indication signal through the OR gate 72 and the output AND gate 73 enabled by the mode selection signal Mo to an indication output line 77. The indication signal is indicative of the fact that any one of the first through third faults are propagated to the next rank. Likewise, the first AND gate 751 is enabled by the mode selection signal Mo of the logic "1" level and is given the logic "1" level signal sent from the first Exclusive OR gate 711. The resultant first AND gate 751 produces a fault location signal through a first output signal line 781. The other AND gates 752 to 753 are kept closed and produces the logic "0" levels through second and third output signal lines 782 and 783. It is possible to detect which one of the faults is propagated by monitoring the fault location signal. Consequently, the first fault f1 is propagated from the second rank to the third rank in the above-mentioned example.

In a like manner, the fault simulation is further carried out as regards the first fault which is propagated to the third rank. As shown in FIG. 5, propagation of the first fault f1 is detected as a result of a simulation of the second AND gate 252.

Subsequently, the fault simulations of the fourth through sixth faults f4 to f6 are simultaneously executed by the first through fourth simulation units 611 to 614 to detect propagation of the sixth fault f6 like in FIG. 6. At any rate, the first through (k−1)-th faults can be simultaneously simulated by the use of the first through k-th simulation units 611 to 61$k$.

Figure 8:
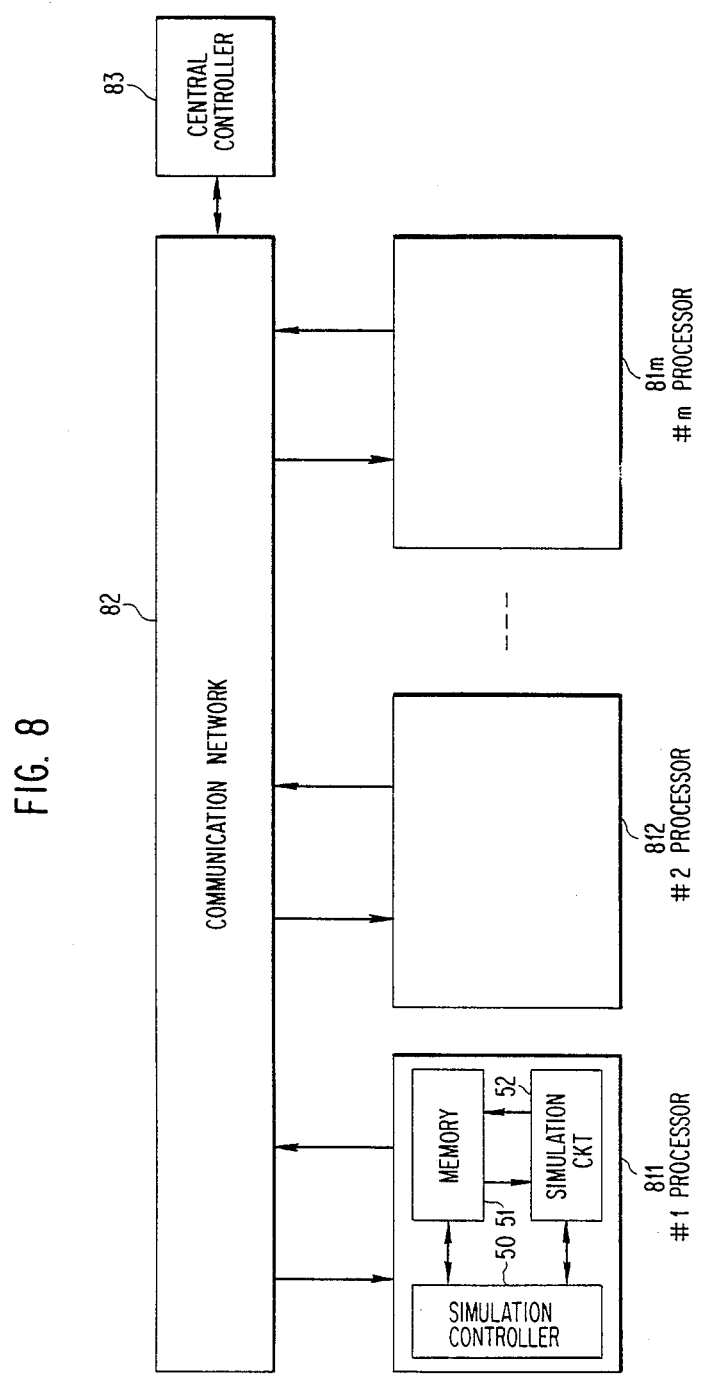
FIG. 8 is a block diagram of a simulation system which uses a plurality of the logic simulators illustrated in FIG. 7.

Referring to FIG. 8, a simulation system according to a third embodiment of this invention comprises first through m-th simulation processors 811 to 81$m$ each of which is similar to that illustrated in FIG. 7 and which is coupled to a communication network in parallel. The communication network 82 is controlled by a central controller 83. Like in FIG. 7, each of the first through m-th simulation processors 811 to 81m comprises a simulation controller 50, a memory 51, and a simulation circuit 52 and is operated in a manner similar to the system illustrated in FIG. 7.

However, it is noted here that the first through m-th simulation processors 811 to 81m share simulations for a logic circuit model with one another. To this end, the logic circuit model in question is divided into a plurality of partial models which are assigned to the simulation processors 811 to 81m. Each simulation processor executes the simulations assigned thereto at a high speed in an event driven manner such that a following simulation is carried out only on occurrence of an event different from a normal event. Thus, it is possible to alleviate a burden necessary for the simulations by distributing the simulations to a plurality of the simulation processors.

While this invention has thus far been described in conjunction with a few embodiments thereof, it will readily be possible for those skilled in the art to put this invention into practice in various other manners. For example, the number k may be greater than four, although description is restricted to the case where k=4 and k=5. The simulations described with reference to FIGS. 2 through 6 may be carried out by software.

What is claimed is:

1. A logic simulator for use in simulating a logic circuit model which is defined by a set of connection information signals representative of connections in said logic circuit model and which is operable in response to first through k-th input data signals to produce an output signal where k represents a natural number greater than unity, said logic simulator comprising:

signal producing means for producing said first through k-th input data signals with said set of connection information signals kept unchanged;

simulation means supplied from said signal producing means with said first through k-th input data signals and said connection information signals, said simulation means for simultaneously carrying out first through k-th simulations of said logic circuit model as defined by said connection information signals to produce first through k-th simulation result signals which are representative of results of said first through k-th simulations, respectively; and processing means for processing said first through k-th simulation result signals to produce said output signal.

2. A logic simulator as claimed in claim 1, said logic circuit model being divisible into first through n-th processing stages that are logically related to one another where n is a natural number, wherein said simulation means comprises:

means supplied with said first through k-th input data signals for simultaneously carrying out said first through k-th simulations to simulate a first processing stage of the logic circuit model and to produce said first through k-th simulation result signals as a first rank simulation result signal, respectively;

said processing means comprising:

means responsive to said first through k-th simulation result signals for simultaneously simulating each of the second through n-th processing stages of the logic circuit model successively to produce second through n-th rank simulation result signals, respectively; and means for outputting said n-th rank simulation result signals as an output signal.

3. A logic simulator for use in simulating a logic circuit model which is operable in response to first through k-th input data signals to produce an output signal where k represents a natural number greater than unity, said logic circuit model comprising a plurality of logic elements selectively operating to process signals according to at least one predetermined logic operation, said logic simulator comprising:

signal producing means for producing, at every one of said logic elements, said first through k-th input data signals together with connection information signals for selectively enabling predetermined ones of said logic elements;

first through k-th simulation means representing a predetermined first grouping of ones of said logic elements, said first grouping being supplied with said first through k-th input data signals, respectively, for simultaneously carrying out first through k-th simulations to produce first through k-th simulation result signals which are representative of results of said first through k-th simulations, respectively; and monitoring means coupled to said first through k-th simulation means for monitoring said first through k-th simulation result signals to produce said output signal.

4. A logic simulator as claimed in claim 3, wherein said signal producing means comprises:

production means for simultaneously producing first through k-th logic signals which make each of said logic elements execute said predetermined logic operation; and means for simultaneously supplying said first through k-th logic signals as said first through k-th input data signals to said first through k-th simulation means, respectively.

5. A logic simulator as claimed in claim 3, wherein said signal producing means comprises:

fault signal producing means for simultaneously producing a plurality of fault signals, said fault signals being for selectively causing predetermined ones of said logic elements to operate according to predetermined faulty logic operations; and means for simultaneously supplying said plurality of the fault signals as the input data signals to said first through k-th simulation means.

6. A logic simulator as claimed in claim 3, wherein:

said first simulation means is operable only in a normal simulation mode of simulating each of said logic operations with normal said input data signals, while each of said second through k-th simulation means is selectively operable in the normal simulation mode and a fault simulation mode with fault signals for selectively simulating predetermined faults which occur in predetermined ones of said logic elements;

said logic simulator further comprising:

mode selection means for producing a mode selection signal selecting one of said normal simulation mode and said fault simulation mode; and delivering means for delivering said mode selection signal to said first through k-th simulation means and said signal producing means;

said signal producing means comprises:

logic signal producing means responsive to said mode selection signal for producing a logic signal which makes each of said logic elements execute predetermined faulty logic operations when said mode selection signal is representative of said fault simulation mode;

fault signal producing means responsive to said mode selection signal for simultaneously producing first through (k−1)-th fault signals representative of faults which occur in each of said logic elements, respectively, when said mode selection signal is representative of said fault simulation mode;

means for supplying said logic signal as said first input data signal to said first through k-th simulation means in said fault simulation mode; and means for supplying said first through (k−1)-th fault signals to said second through k-th simulation means as said second through k-th input data signals in said fault simulation mode;

said first simulation means being operable in response to said logic signal to carry out said first simulation in said normal simulation mode while said second through k-th simulation means are operable in response to said logic signal and said first through (k−1)-th fault signals to carry out said second through k-th simulations in said fault simulation mode, respectively.

7. A logic simulator as claimed in claim 6, wherein said monitoring means comprises:

retaining means for retaining said first through k-th simulation result signals to produce first through k-th retained simulation result signals as said output signal; and detecting means responsive to said mode selection signal and coupled to said second through k-th simulation means for detecting influence of said first through (k−1)-th fault signals by comparing said first through k-th simulation result signals which appear in said normal simulation mode and said fault simulation mode.

8. A method of simulating a logic circuit model which is defined by a set of connection information signals representative of connections in said logic circuit model and which is operable in response to first through k-th input data signals to produce an output signal where k represents a natural number greater than unity, said method comprising the steps of:

producing said first through k-th input data signals with said set of connection information signals kept unchanged;

simultaneously carrying out a maximum number of first through k-th simulations of said logic circuit model to produce first through k-th simulation result signals representative of results of said first through k-th simulations in response to said first through k-th input data signals; and monitoring said first through k-th simulation result signals according to a predetermined monitoring procedure to produce said output signal.

9. A method as claimed in claim 8, said logic circuit model comprising a plurality of logic elements each of which is selectively operating to process signals according to at least one predetermined logic operation, wherein said input data signals comprise logic signals which make each of said logic elements execute a predetermined logic operation.

10. A method as claimed in claim 9, wherein said input data signals further comprise fault signals for selectively causing predetermined ones of said logic elements to operate according to predetermined faulty logic operations.

11. A method as claimed in claim 8, said logic circuit model being divisible into a plurality of models and having model numbers preassigned thereto, respectively, wherein said first through k-th simulations are carried out by predetermined models indicated by the model numbers in addition to said first through k-th input data signals.

12. A method as claimed in claim 8, said logic circuit model comprising a plurality of logic elements each of which is for performing at least one predetermined simulation operation and which has an initial output state, wherein said first through k-th simulation result signals are classified into a reference result signal equal to said initial output state and a different result signal different from said initial output state;

said processing step comprising the steps of:

distinguishing said different result signal from said reference result signal on the basis of a comparison with said initial output state; and carrying out a subsequent simulation on production of said different result signal alone to produce said output signal.

* * * * *